United States Patent [19]
McClure

[11] Patent Number: 5,471,415
[45] Date of Patent: Nov. 28, 1995

[54] CACHE TAG MEMORY

[75] Inventor: David C. McClure, Carrollton, Tex.

[73] Assignee: SGS-Thomson Microelectronics, Inc., Carrollton, Tex.

[21] Appl. No.: 85,588

[22] Filed: Jun. 30, 1993

[51] Int. Cl.⁶ ............................ G11C 15/00; G11C 13/00
[52] U.S. Cl. ............................ 365/49; 365/190; 365/202; 365/189.07; 395/445; 395/280; 364/253
[58] Field of Search ................... 365/49, 189.07, 365/189.01, 202; 395/425; 364/253

[56] References Cited

U.S. PATENT DOCUMENTS

| | | | |
|---|---|---|---|
| 5,014,240 | 5/1991 | Suzuki | 365/49 |
| 5,018,099 | 5/1991 | Burrows | 365/49 |
| 5,034,636 | 7/1991 | Reis et al. | 307/530 |
| 5,111,386 | 5/1992 | Fujishima et al. | 365/189.05 |
| 5,226,009 | 7/1993 | Arimoto | 365/189.04 |

Primary Examiner—Viet Q. Nguyen
Attorney, Agent, or Firm—Kenneth C. Hill; Lisa K. Jorgenson; Richard K. Robinson

[57] ABSTRACT

A comparator system for a cache tag RAM memory that makes use of data bus lines already available on the cache tag RAM. The true data bus lines are connected together at a connection point and form a "wired" connection or configuration. A "wired" connection may be for example, a "wired OR" "wired NOR" "wired AND" or "wired NAND" according to the present invention. The complement data bus lines on the cache tag RAM are connected in a similar fashion. The comparator system is connected to the cache tag RAM data bus lines and generates a hit or miss signal based on the data on the cache tag RAM data bus lines and input data that controls transistors connected to the cache tag RAM data bus lines, resulting in a faster comparison function.

26 Claims, 5 Drawing Sheets

CACHE TAG MEMORY

CROSS-REFERENCE TO RELATED APPLICATIONS

The present application is related to U.S. patent application Ser. No. 08/085,980, entitled "Method and Apparatus For Parallel Testing of Memory", and U.S. patent application Ser. No. 08/085,760, now patented U.S. Pat. No. 5,349,243 entitled "Latch Controlled Output Driver" filed of even date herewith by the inventor hereof, assigned to the assignee herein, and incorporated herein by reference.

BACKGROUND OF THE INVENTION

1. Field of the Invention

The present invention relates in general to digital computer systems, and more particularly to cache memory systems.

2. Description of the Prior Art

Cache memories are used in many computer systems to improve system performance. A cache memory is a relatively small, fast memory, which resides between a central processor and main system memory. Whenever the processor reads the contents of a memory location which is stored in the cache memory, the time required to access such location is drastically reduced. A good cache technique can provide a "hit ratio" of well over ninety percent, meaning that no main memory access is necessary for over ninety percent of the read operations performed. Access of data which is stored in the cache can improve access times by factors of three to ten times.

A cache performs functions requiring two different types of memory. The first type is the data memory, in which the data is actually stored. The second type is known as a cache tag memory or cache tag RAM, which is used to determine which memory locations are actually stored in the cache. In general, the cache tag RAM contains a plurality of entries corresponding to the entries of the data cache. Each entry is indexed by some number of least significant bits of the address generated by the central processor, with the tag entry itself containing the most significant bits of the memory address location which is stored in the corresponding data cache entry. If the most significant bits stored in the cache tag match the most significant bits of the address currently being generated, with the least significant bits of this address acting as an index to the tag RAM, a cache "hit" has occurred and the data to be read may be taken from the corresponding data cache entry. If data corresponding to the desired address is not located in the data cache, the tag entry will not match the most significant bits of the address, and a "miss" occurs. This indicates that the data must be retrieved from main system memory and placed into the data cache. At this time, the current contents of the cache tag entry are overwritten with the most significant bits of the newly retrieved address.

More information on cache memories may be found in Stone, *High-Performance Computer Architecture*, Addison-Wesley Publishing Co. (1987).

It would be desirable to provide a cache tag memory which operates faster and more efficiently than designs currently available.

SUMMARY OF THE INVENTION

The present invention provides a comparator system for a cache tag RAM memory that makes use of data bus lines already available on the cache tag RAM. The true data bus lines are connected together at a connection point and form a "wired" connection or configuration. A "wired" connection may be for example, a "wired OR", "wired NOR" "wired AND" or "wired NAND" according to the present invention. The complement data bus lines in the cache tag RAM are connected in a similar fashion. The comparator system is connected to the cache tag RAM data bus lines and generates a hit or miss signal based on the data on the cache tag RAM data bus lines and input data that controls transistors connected to the cache tag RAM data bus lines, resulting in a faster comparison function.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
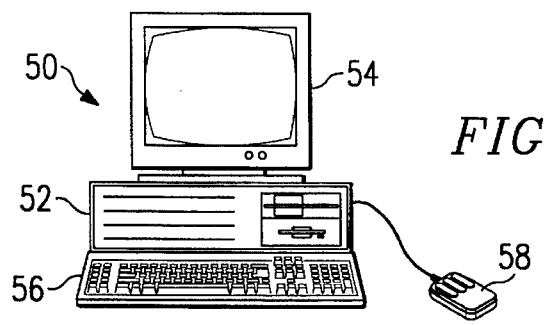
FIG. 1 is an illustration of a data processing system that may be utilized to implement the present invention.

With reference now to the figures and in particular with reference to FIG. 1, a data processing system in accordance with a preferred embodiment of the present invention is illustrated. A personal computer 50 is depicted which includes a system unit 52, a video display terminal 54, a keyboard 56, and a mouse 58.

Figure 2:
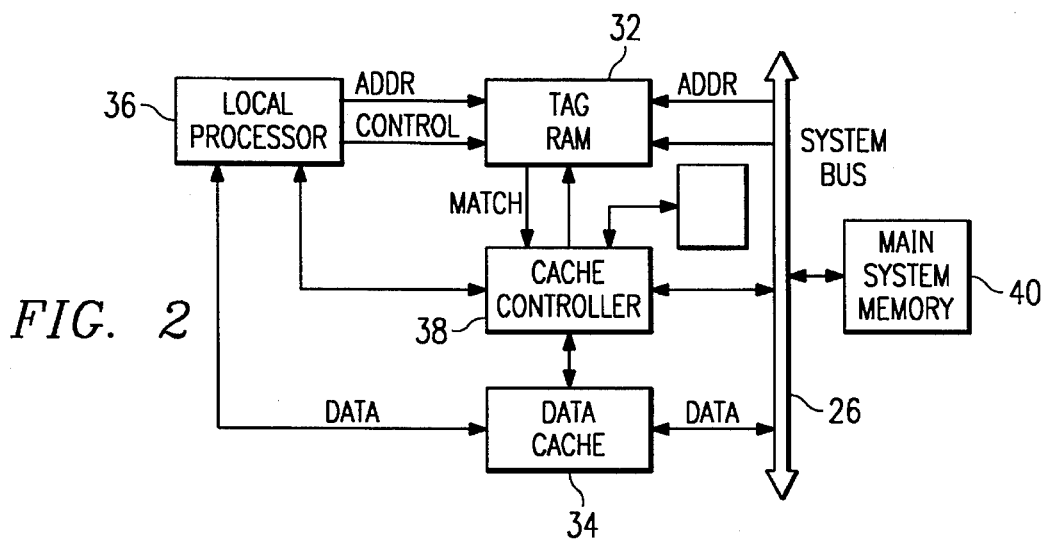
FIG. 2 is a high level block diagram showing a cache memory utilizing a cache tag memory according to the prior art.

FIG. 2 is a high level block diagram showing a cache memory utilizing a cache tag memory according to the prior art. Such a cache can be utilized on the computer 50 of FIG. 1. A cache tag RAM 32 and a data cache 34 communicate with system bus 26 and processor 36. Cache controller 38 performs the usual cache control functions found in caches which are suitable for use with single processor systems.

Data cache 34 exchanges data with the processor 36 and system bus 26 under the control of cache controller 38. Various control signals are exchanged by the processor 36 and cache controller 38, and between the cache controller 38 and the system bus 26. Address and control signals are communicated from processor 36 to cache tag RAM 32. Address and control signals are also communicated between cache tag RAM 32 and system bus 26.

Cache tag RAM 32 also passes a signal MATCH to cache controller 38. MATCH indicates that the memory location currently being addressed by processor 36 resides in the data cache 34, and that the entry is currently valid. Cache controller 38 then causes the location being accessed by local processor 36 to be read directly from data cache 34. If MATCH indicates a miss, cache controller 38 causes the requested address to be loaded into the data cache 34 and tag RAM 32 prior to completing the local processor memory request.

As known in the art, cache tag RAM 32 is used to determine which memory locations are actually stored in data cache 34. In general, cache tag RAM 32 contains a plurality of entries corresponding to the entries of data cache 34. Each entry is indexed by some number of least significant bits of the address generated by a central processor, with the tag entry itself containing the most significant bits of the address of the memory location which is stored in the corresponding data cache entry. If the most significant bits stored in tag RAM 32 match the most significant bits of the address currently being generated, with the least significant bits of this address acting as an index to the tag RAM 32, a cache "hit" has occurred and the data to be read may be taken from the corresponding data cache entry. If data corresponding to the desired address is not located in data cache 34, the tag entry will not match the most significant bits of the address, and a "miss" occurs. This indicates that the data must be retrieved from main system memory 40 and placed into data cache 34. At this time, the current contents of the cache tag entry are overwritten with the most significant bits of the newly retrieved address, and the corresponding data cache entry is overwritten with a new data cache entry.

Figure 3:
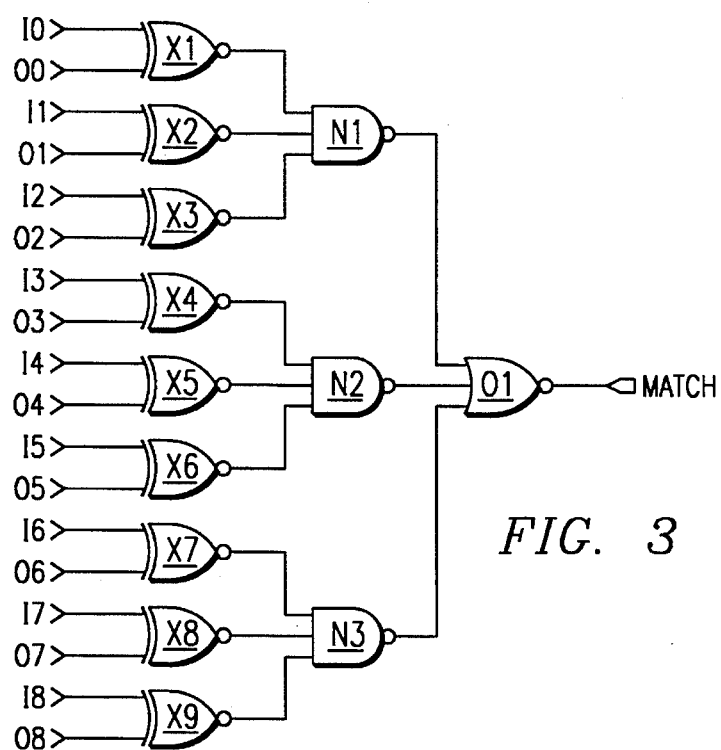
FIG. 3 is a schematic diagram of a cache tag RAM compare circuit known in the prior art.

In the schematic diagram of FIG. 3, the cache tag RAM compare circuit is constructed from exclusive or (XOR) X1–X9, NAND gates N1–N3, and NOR gate 01. This compare circuit compares data read out of the cache tag RAM and the data presented at the input to the cache tag RAM. The data presented at the inputs of the cache tag RAM typically represent the upper order, or most significant, bits of the address bus. The address data input into the cache tag RAM is sent into the exclusive OR gates X1–X9 through points I0–I8. The data from the cache tag RAM is sent into exclusive OR gates X1–X9 through points 00–08. The result of these comparisons may be detected at point MATCH, which is connected to NOR gate 01. The drawback to this type of design is that three stages are required for determining whether a hit or miss has occurred. The increased number of stages results in an increased amount of time needed to determine hits or misses.

Figures 4, 5:
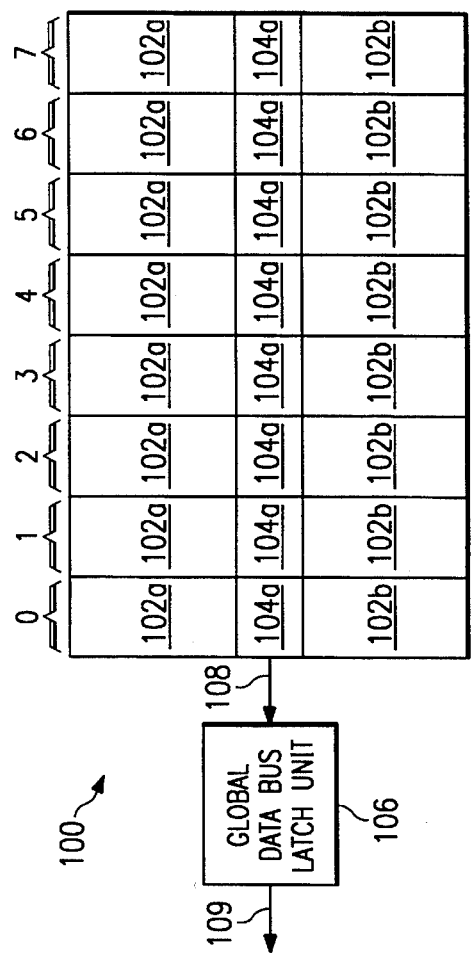
FIG. 4 is a block diagram of a memory unit.
FIG. 5 is a block diagram of a memory group from FIG. 4.

Referring now to FIG. 4, a block diagram of a memory array 100, in which a cache tag memory may be implemented, is illustrated. Memory array 100 (also just called a "memory") is subdivided into eight memory groups: 0–7. Each memory group contains a memory block 102a, a memory block 102b, and an input/output (I/O) block 104a. I/O block 104a is interposed between the two memory blocks 102a and 102b. Data bus latch block 106 is connected to the I/O blocks 104a of memory groups 0–7 via a data array 108. Data bus latch block 106 also has an output array 109.

Referring now to FIG. 5, a block diagram of a memory group from FIG. 4, including memory block 102a, memory block 102b, and I/O block 104a is illustrated. Each memory group, 0–7, in FIG. 4 includes nine memory subgroups A0–A8. Each memory subgroup includes four memory segments 10a–10d, four sense amplifiers 10e–10h, and a data bus driver 10i. Each memory segment includes eight columns of bit line pairs and is connected to one of the four sense amplifiers. Such an arrangement is well known to those skilled in the art. In turn, the four sense amplifiers in a memory subgroup are connected to a data bus driver 10i. Each of the data bus drivers 10i in memory subgroups A0–A8 have a pair of data lines, data true (DT) and data complement (DC), connected to data bus latch 106 in FIG. 4. All of the data lines from all of the I/O blocks form data array 108 in FIG. 4. Each data line is associated with a data output.

Figure 6:
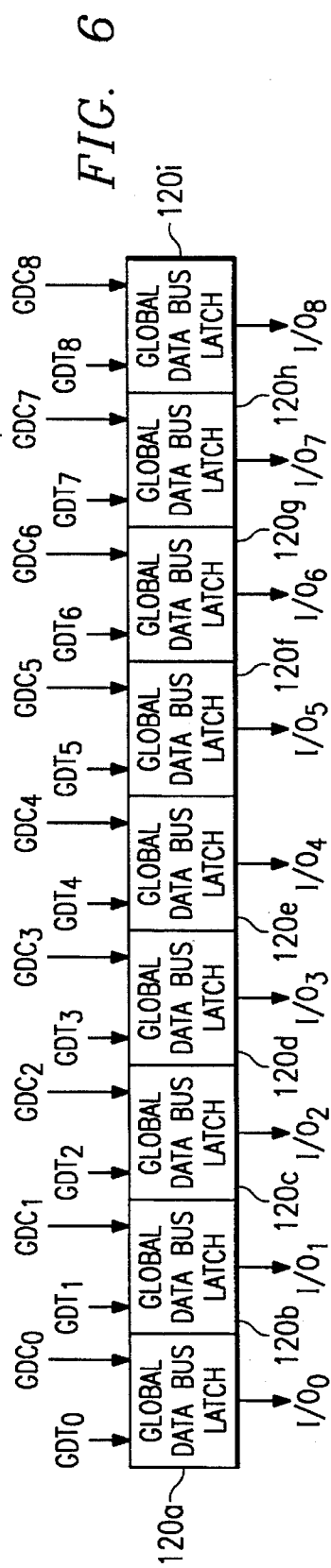
FIG. 6 is a block diagram of a data bus latch block with a data array and an output array from FIG. 4.

Referring now to FIG. 6, a block diagram of data bus latch block 106 with data array 108 and output array 109 is illustrated. Data bus latch block 106 includes data bus latches 120a–120i. Each data bus latch has a pair of data lines and a I/O line. The data lines form data array 108 and the I/O lines form output array 109. The data lines from the data buses are connected in a "wired NOR" connection. For example, referring back to FIG. 5, which is representative of a memory group 7 in FIG. 4, the data bus drivers in memory subgroups A0–A8 would have the following connections: A0 to $DT_0$ and $DC_0$, A1 to $DT_1$ and DC1; A2 to $DT_2$ and $DC_1$ . . . A8 to $DT_8$ and $DC_8$. Each of the other memory groups 0-6 also would have similar connections to the same data lines $DT_0$, and $DC_0$, $DT_1$ and $DC_1$ . . . $DT_8$ and $DC_8$. The data bus drivers may be connected together at a connection point, forming a true connection point for $GDT_0$–$GDT_8$ and a complement connection point for $GDC_0$–$GDC_8$ to form a "wired NOR" configuration. Although the depicted embodiment employs a "wired NOR" configuration, any "wired" configuration may be employed in accordance with a preferred embodiment of the present invention.

The "wired NOR" data bus drivers provide negative true logic of an OR gate, with the output going low if any input is high or a logic 1. The present invention takes advantage of the "wired NOR" configuration of the data buses. In a test mode, multiple blocks of memory may be selected or enabled and/or multiple sense amplifiers within a block may be enabled. The multiple bits of data being sensed should all have the same data for a given output in accordance with a preferred embodiment of the present invention. The test mode primarily makes use of the existing circuitry and does not diminish the normal performance of the memory unit.

Figure 7:
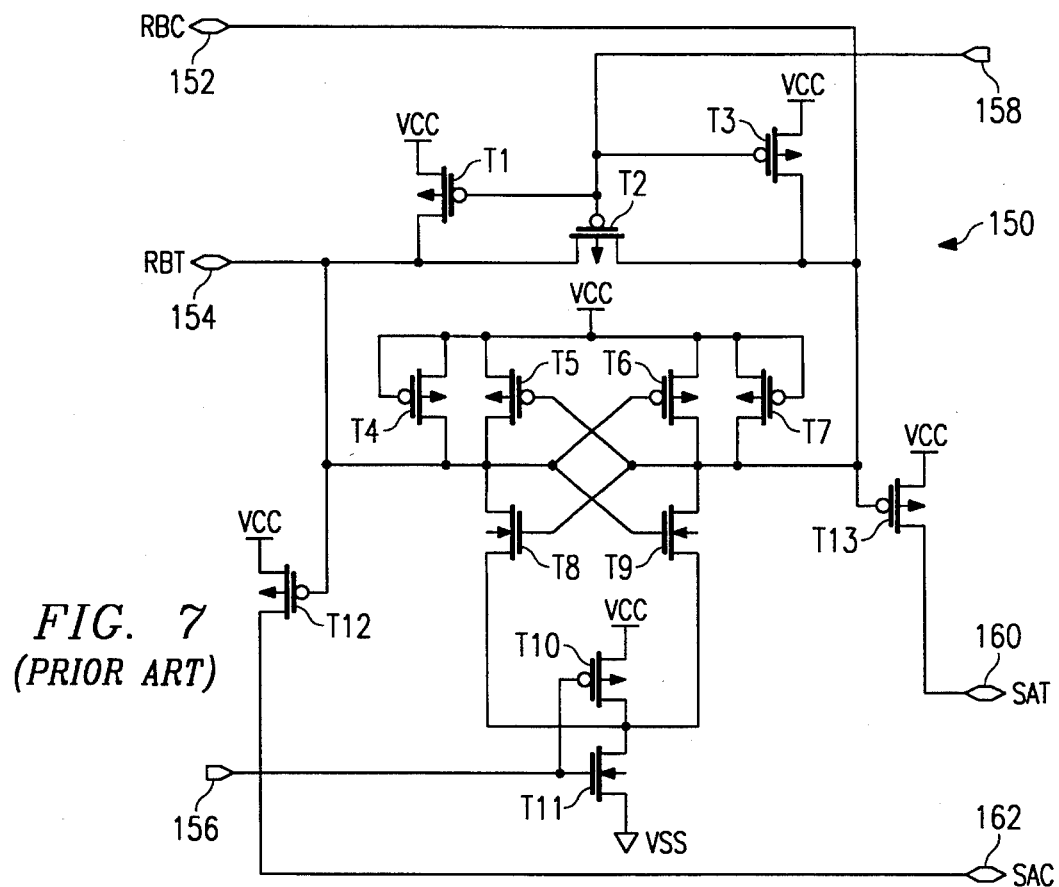
FIG. 7 is a schematic diagram of a sense amplifier known in the prior art.

Referring now to FIG. 7, a schematic diagram of a sense amplifier known in the prior art is depicted. Sense amplifier 150 is constructed from transistors T1–T16. Sense amplifier 150 is a clocked dynamic random access memory (DRAM) style sense amplifier in accordance with a preferred embodiment of the present invention. These transistors are metal-oxide semiconductor field effect transistors (MOSFETs). Transistors T1–T7, T10, T12–T13 are p-channel MOSFETs, while transistors T8–T9 and T11 are n-channel MOSFETs. Sense amplifier 150 is powered by connecting the sources of transistors T1, T3–T7, and to power supply voltage VCC and by connecting the source of transistor T11 to power supply voltage VSS. Power supply voltage VCC is typically at a higher voltage than power supply voltage VSS.

Transistors T5 and T6 are cross-coupled; transistor T8 and T9 also are cross-coupled. These transistors form a flip-flop. A signal is input into sense amplifier 150 through points 152 and 154. A complementary read bus line RBC is connected to point 152, while a true read bus line RBT is connected to point 154. Sense amplifier 150 is enabled and disabled by applying a signal to the gates of transistors T10 and T11 through point 156 and through the gate of transistor T2 via point 158.

When the signal at point 156 and 158 is high transistors T1–T3, and T10 are turned off and transistor T11 is turned on enabling sense amplifier 150. A low signal at point 156 and 158 results in transistors T1–T3 and T10 being turned on and transistor T11 being turned off, disabling sense amplifier 150. The signal enabling sense amplifier 150 is a clocked signal in accordance with a preferred embodiment of the present invention.

Transistors T1–T3 are employed to precharge sense amplifier 150. RBC and RBT are typically high when data signals are not being sent to the sense amplifier, resulting in the gates of transistors T12 and T13 being turned off. When a sense signal is sent into points 156 and 158, typically, only one sense amplifier out of the four in a memory subgroup as illustrated in FIG. 5 normally can be enabled at any given cycle.

Additionally, the four sense amplifiers in a memory subgroup are tied together at points 160 and 162. A high point 152 results in transistor T15 remaining in an off mode. The low signal at point 154 results in transistor T14 being turned on. Output signals are sent through points 160 and 162. Point 160 receives a true signal, SAT while the complementary signal SAC, is sent through point 162. A high signal at point 152 and a low signal at point 154 results in a high signal at point 162 and a low signal at point 160.

Figure 8:
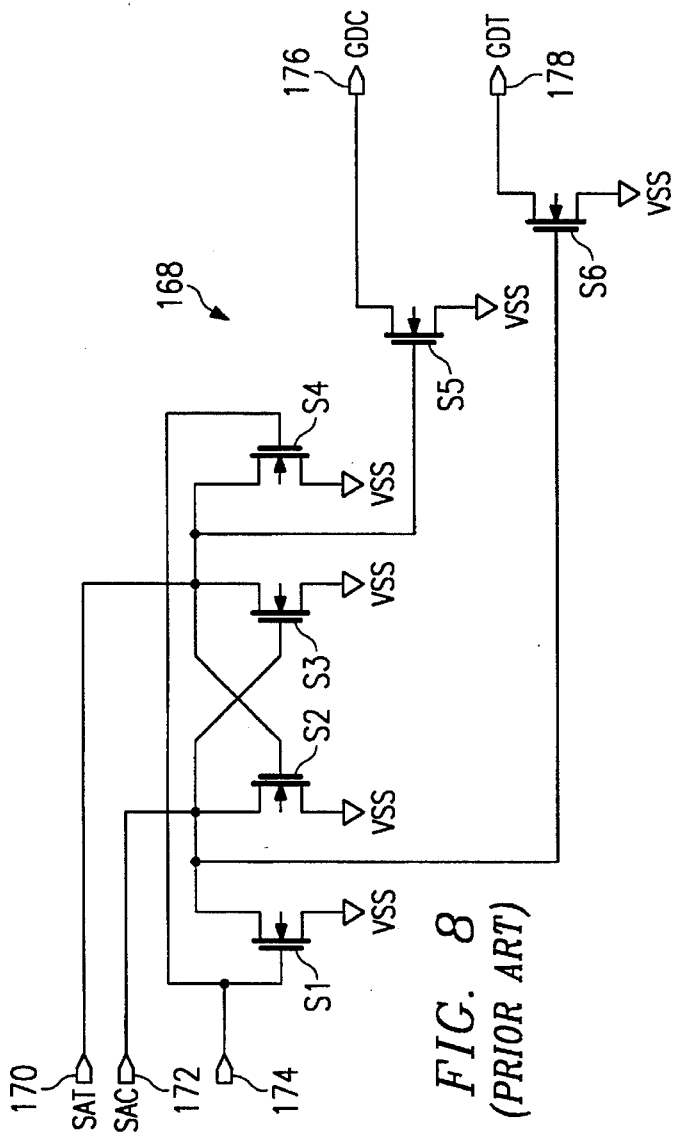
FIG. 8 is a schematic data bus driver known in the prior art.

Referring now to FIG. 8, a schematic diagram of a data bus driver known in the prior art is illustrated. Data bus driver 168 is constructed from transistors S1–S6. The transistors are n-channel MOSFETs. The circuit is powered by connecting the drains of transistors S1–S6 to power supply voltage VSS.

Signals SAT and SAC from sense amplifier 150 are sent into data bus driver 168 at points 170 and 172 by connecting point 160 to point 170 and connecting point 162 to point 172. Data bus driver 168 is precharged to VSS by applying a signal to point 174, which is connected to the gates of transistors S1 and S4. This signal may be a clock signal as used in sense amplifier 150.

A complement signal, GDC, is output at point 176 and a true signal GDT is output at point 178. Transistors S2 and S3 are connected in a cross-coupled configuration and function as a latch. When either signal SAT or SAC is high during sensing, one of the transistors S5 or S6 is turned on to selectively pull-down the signal GDT or GDC. When the signal SAC at point 172 is high, signal GDT at point 178 is pulled low, and when the signal SAT at point 170 is high, signal GDC is pulled low at point 176. Data buses connected to points 176 and 178 are precharged high between sensing cycles. As mentioned before, all of the data bus drivers for a particular output for different memory blocks are all tied to the same data lines resulting in a "wired NOR" set up. Multiple data bus drivers 168 are "wired NOR" together at points 176 and 178 and then connected to a data bus latch.

Figure 9:
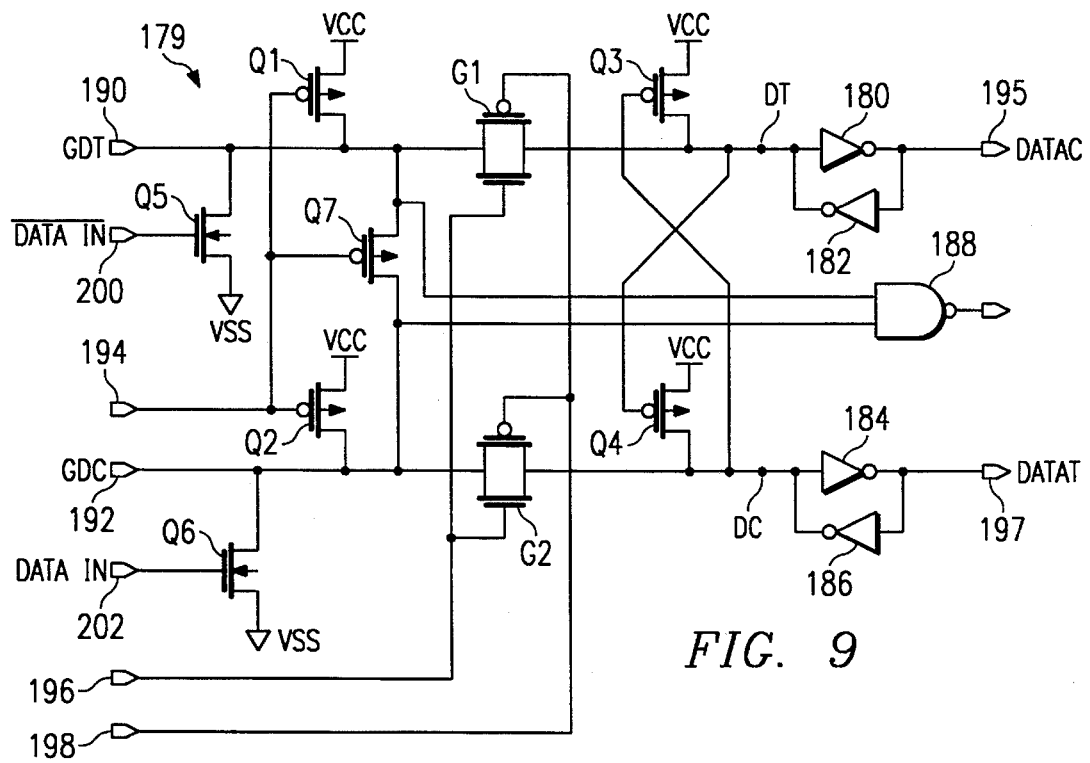
FIG. 9 is a schematic diagram of a data bus latch.

Referring now to FIG. 9, a schematic diagram of a data bus latch is illustrated. Data bus latch 179 is constructed from transistors Q1–Q7, pass gates G1 and inverters 180, 182, 184, and 186; and NAND gate 188. Transistors Q1–Q7 are p-channel MOSFETs while transistors Q5 and Q6 are n-channel MOSFETs. Data bus latch 179 is powered by connecting transistors Q1–Q4 to power supply voltage VCC and by connecting transistors Q5 and Q6 to power supply voltage VSS. The GDT and GDC signals at points 190 and 192 are precharged to VCC by applying a signal to point 194, which controls the gates of transistors Q1 and Q2.

Inverters 180 and 182 and inverters 184 and 186 are used as latches to hold or "latch" signals from points 190 and 192. Data bus latch 179 is tied to a data bus driver by connecting point 176 from FIG. 8 to point 192, a complement connection point, and by connecting point 178 from FIG. 8 to point 190, a true connection point. Thus, signal GDT is applied to point 190 while signal GDC is applied to point 192. Pass gates G1 and G2 are employed to allow a signal to pass from points 190 and 192 to the latches formed by the inverters. These pass gates are controlled by applying signals to points 196 and 198. The pass gates are enabled by applying a high signal to point 196 and a low signal to point 198. Output signals DATAC and DATAT are sent out from data bus latch 179 at points 195 and 197, respectively.

The gate of transistor Q5 is controlled by a signal DATA_IN complement (/DATA_IN) applied to point 200 while the gate of transistor Q6 is controlled by signal DATA_IN applied to point 202. DATA_IN and /DATA_IN are both low when the cache tag RAM is not in a compare mode. DATA_IN and /DATA_IN are synchronized with the start of a clock cycle. Initially both signals are low, and after the bus precharge has been completed and in parallel with the sense amplifier driving the data bus, one of the other DATA_IN or /DATA_IN signals goes high based on the state of the data at the I/O input.

The DATA_IN and /DATA_IN signals input into a data bus latch 179 in memory array 100 represent a portion of the address that is to be compared with the address stored in memory array 100. The data in memory array 100 is output as signals GDT and GDC.

If the sense amplifier is sensing a logic 1 and the data input is a logic 1, then signal GDC at point 192 is pulled low by the sense amplifier. Signal DATA IN is high, also pulling signal GDC low. This result is redundant to what the sense amplifier has accomplished. Likewise, if a logic 0 is read from the sense amplifier and the data input, then the signal GDT is pulled low and the signal GDC remains high. If the sense amplifier data does not match the data input, then both signals GDT and GDC will be pulled low. Such a result is an indication of a "miss". Normally, such a result would "crowbar" the outputs, but in the compare mode in the cache tag RAM, the outputs are tristated. As a result, such a situation is not a problem. If necessary, special provisions may be made when leaving the compare mode during a "miss" to prohibit crowbarring.

Figure 10:
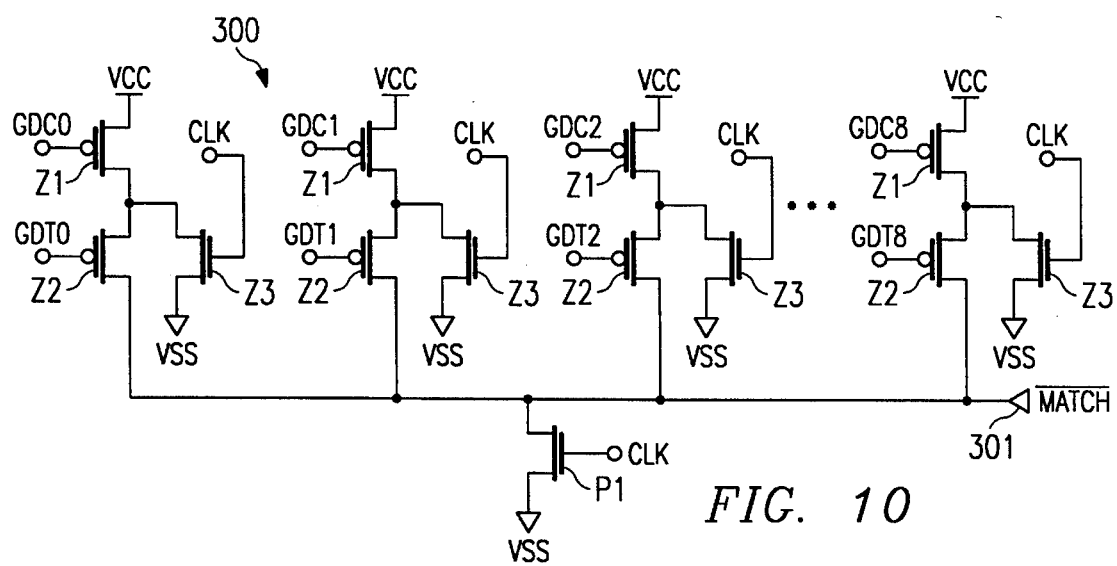
FIG. 10 is a schematic diagram of a cache tag RAM compare circuit.

Referring next to FIG. 10, a schematic diagram of a cache tag RAM compare circuit 300 is depicted in accordance with a preferred embodiment of the present invention. The cache tag RAM compare circuit includes transistors, Z1 and Z2. These transistors are p-channel 8 MOSFETs. Z1 has a source connected to power supply voltage VCC and a drain connected to the source of transistor Z2. Transistor Z2 has a drain connected to output MATCH complement (/MATCH), which indicates the existence of a "hit" or a "miss". Additionally, the drain of transistor Z3 is connected to the drain of transistor Z1 and the source of transistor Z2. The gate of transistor Z1 is controlled by a signal GDC while the gate of transistor Z2 is controlled by a signal GDT. The use of transistor Z3 is to alleviate possible charge sharing problems at point 301. This transistor may be removed if charge sharing is not a problem.

The logic to sum all of the "hit" and "miss" information from the data buses may be implemented in various forms in accordance with a preferred embodiment of the present invention. The output from the tag RAM memory originates from the data bus lines as signals $GDC_0$–$GDC_8$ and $GDT_0$–$GDT_8$. The data input into the cache tag RAM are the DATA_IN and/DATA_IN signals controlling transistors Q5 and Q6 in FIG. 9. For any given GDC ($GDC_0$–$GDC_8$) and GDT ($GDT_0$–$GDT_8$) signal pair, if both signals are low the output MATCH is pulled high. If all of the signals match, then output /MATCH remains low.

The output /MATCH can be precharged low between cycles by transistor P1, while both signals GDC and GDT have been precharged high. In addition, if necessary, a static n-channel device (a small device) may be tied to /MATCH with the gate connected to power supply voltage VCC, the source connected to power supply voltage VSS as a small static load on the output /MATCH.

Alternatively, the gate of transistor P1 may have a bias voltage applied to it. If all of the GDT, $GDT_0$–$GDT_8$, signals go low during a cycle and all of the GDC, $GDC_0$–$GDC_8$, signals are high during this cycle, the charge sharing of the output /MATCH to the series p-channel nodes could potentially disrupt the output /MATCH, if a static load is not used. Transistor Z3 can be used to precharge the series nodes to power supply voltage VSS between clock cycles. By precharging the data path to the proper state between cycles, the subsequent data access or match can occur very quickly because all of the transistor sizings and ratios can favor the logic transitions that can occur during the accessing of the cache tag RAM.

By proper sharing of source/drains in the transistors, the diffusion capacitance on the output /MATCH and the series nodes may be kept at a minimum to maximize speed in the cache tag RAM.

Figure 11:
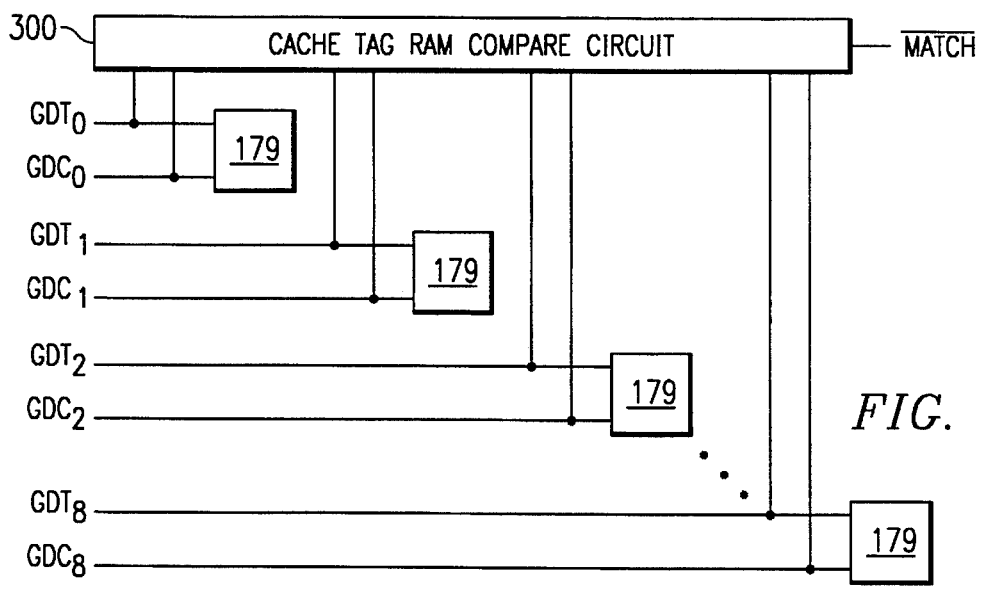
FIG. 11 is a schematic diagram of a cache tag RAM compare circuit and data bus latch.

Referring to FIG. 11, a block diagram of cache tag RAM compare circuit 300, data bus latch 179, and the various connections to signals $GDC_0$–$GDC_8$ and $GDT_0$–$GDT_8$ is shown in FIG. 6. A data bus latch 179 is connected each of the data bus lines carrying signals $GDC_0$–$GDC_8$ and $GDT_0$–$GDT_8$ from memory array 100. Additionally, each GDC and GDT signal for a particular bit is also connected to cache tag RAM compare circuit 300 to provide the reduced number of gate levels needed to determine whether a match has occurred between the address input and the data output from memory array 100.

Figure 12:
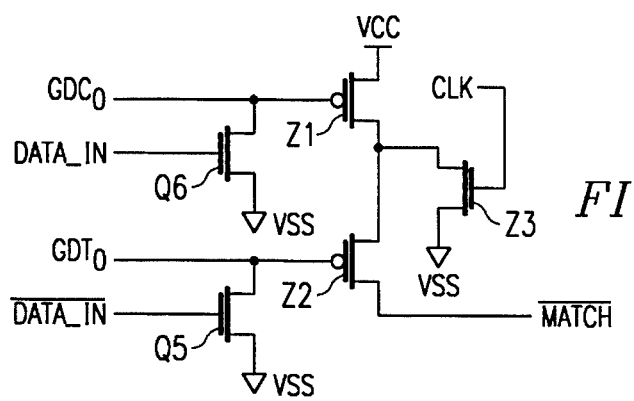
FIG. 12 is a schematic diagram of a connection between cache tag RAM circuit and data bus latch.

FIG. 12 is a schematic diagram illustrating a connection between cache tag RAM compare circuit 300, a data bus latch 179, and signal $GDC_0$ and $GDT_0$ for a single bit. As can be seen, the gate of transistor Z1 is connected to the drain of transistor Q6. Additionally, the gate of transistor Z1 is connected to a signal $GDC_0$ from a data bus line. The signal $GDC_0$ represents a single bit of data output from memory array 100. A signal DATA IN controls transistor Q6. Similarly, transistor Z2 is connected to the drain of transistor Q5. Additionally, transistor Z2 has its gate connected to a signal $GDT_0$ from a data bus line connected to memory array 100. The gate of transistor Q5 is controlled by signal/DATA_IN. Thus, if the output signal represented by signals $GDC_0$ and $GDT_0$ match the data input, DATA_IN and/DATA_IN, respectively, the line leading to the /MATCH output is not pulled high. On the other hand, if the DATA_IN does not match the data output, the /MATCH line is pulled high. If any of the bits do not match, the /MATCH line will be pulled high indicating that the address in the memory does not match the address being input as a comparison.

Although the present invention has been described with reference to single processor systems, it is equally applicable to multi-processor systems.

Using the above technique, the XOR operation depicted in FIG. 3 is "hidden" into the normal sensing in the cache tag RAM. Furthermore, no additional gate delay occurs during this operation. The cache tag RAM architecture disclosed may be used for both synchronous and asynchronous cache tag RAMs in accordance with a preferred embodiment of the present invention. As a result, the cache tag memory may operate at a faster rate.

The present invention is depicted using MOS technology. Other types of technology and transistors may be used in accordance with a preferred embodiment of the present invention.

While the invention has been particularly shown and described with reference to a preferred embodiment, it will be understood by those skilled in the art that various changes in form and detail may be made therein without departing from the spirit and scope of the invention.

What is claimed is:

1. A digital computer system comprising:

a processor a main memory;

a data cache connected to the processor and the main memory;

a true data signal and a complement data signal; and a tag cache memory connected to the processor and the main memory, the tag cache memory including:

a plurality of memory groups, each memory group having a plurality of true and complement outputs;

a plurality of true and complement data bus lines, wherein each true data bus line is connected to a true output from each of the plurality of memory groups, each complement data bus line is connected to a complement output from each of the plurality of subgroups, and the true and complement data bus lines having the true and complement data signals, respectively;

a plurality of data bus circuits, each data bus circuit including:

a true circuit input and a complement circuit input, wherein the true and complement circuit inputs are connected to a true and complement data bus line;

a true circuit output and a complement circuit output;

a first transistor, having a drain connected to the true circuit input, a source connected to a power supply voltage, and a gate connected to the complement data signal; and a second transistor having a drain connected to the complement circuit input, a source connected to the power supply voltage, and a gate connected to the true data signal; and a compare circuit having a plurality of input pairs, each input pair having a true input and a complement input, and an output for indicating the presence of a hit, wherein true input of each input pair is connected to the true circuit input of a data bus circuit and the complement input of each input pair is connected to the complement circuit input of the data bus circuit, wherein the presence of a hit may be indicated at the output of the compare circuit.

2. The digital computer system of claim 1, wherein the first and second transistors are n-channel MOSFETs.

3. The digital computer system of claim 2, wherein the connections between the true and complement data bus lines and the true and complement outputs from the memory groups are wired NOR connections.

4. The digital computer system of claim 1, wherein the compare circuit further comprises:

a plurality of transistors pairs, wherein each transistor in a pair is connected in series, a source of a first transistor in a pair is connected to a first power supply voltage and a drain of a second transistor in the pair is connected to the output of the compare circuit and wherein a gate of the first transistor is connected to the complement input of an input pair and a gate of the second transistor is connected to the true input of the input pair.

5. The digital computer system of claim 4, wherein the compare circuit further includes a transistor having a drain connected to the output, a source connected to a second power supply voltage, and a gate connected to a clock signal, wherein the output of the compare circuit may be precharged to a logic state.

6. The digital computer system of claim 4, wherein the compare circuit further includes a transistor having a drain connected to a drain of the first transistor in each pair of transistors, a source connected to the second power supply voltage, and a gate connected to the clock signal, wherein the series node of each pair of transistors may be precharged to decrease data access time.

7. The digital computer system of claim 4, wherein the first transistor and the second transistor are p-channel MOSFETs.

8. The digital computer system of claim 5, wherein the transistor having a drain connected to the output, a source connected to the second power supply voltage, and a gate connected to a clock signal is a n-channel MOSFET.

9. The digital computer system of claim 5, further comprising transistor having a drain connected to a drain of the first transistor in each pair of transistors, a source connected to the second power supply voltage, and a gate connected to the clock signal.

10. A cache tag memory comprising:

a plurality of memory groups, each memory group having a plurality of true and complement outputs;

a plurality of true and complement data bus lines, wherein each true data bus line is connected to a true output from each of the plurality of memory groups, each complement data bus line is connected to a complement output from each of the plurality of groups, and the true and complement data bus lines having the true and complement data signals, respectively;

a plurality of data bus circuits, each data bus circuit including:
 a true circuit input and a complement circuit input, wherein the true and complement circuit inputs are connected to a true and complement data bus line;
 a true circuit output and a complement circuit output;
 a first transistor having a drain connected to the true circuit input, a source connected to a power supply voltage, and a gate connected to the complement data signal; and
 a second transistor having a drain connected to the complement circuit input, a source connected to the power supply voltage, and a gate connected to the true data signal; and a compare circuit having a plurality of input pairs, each input pair having a true input and a complement input, and an output for indicating the presence of a hit, wherein true input of each input pair is connected to the true circuit input of a data bus circuit and the complement input of each input pair is connected to the complement circuit input of the data bus circuit, wherein the presence of a hit may be indicated at the output of the compare circuit.

11. The cache tag memory of claim 10, wherein the first and second transistors are n-channel MOSFETs.

12. The cache tag memory of claim 11, wherein the connections between the true and complement data bus lines and the true and complement outputs from the memory groups are wired NOR connections.

13. The cache tag memory of claim 10, wherein the compare circuit further comprises:

a pair of transistors connected in series, wherein a source of a first transistor in a pair is connected to a first power supply voltage and a drain of a second transistor in the pair is connected to the output of the compare circuit and wherein a gate of the first transistor is connected to the complement input of an input pair and a gate of the second transistor is connected to the true input of the input pair.

14. The cache tag memory of claim 13, wherein the compare circuit further includes a transistor having a drain connected to the output, a source connected to a second power supply voltage, and a gate connected to a clock signal, wherein the output of the compare circuit may be precharged to a logic state.

15. The cache tag memory of claim 13, wherein the compare circuit further includes a transistor having a drain connected to a drain of the first transistor in each pair of transistors, a source connected to a second power supply voltage, and a gate connected to the clock signal, wherein the series node of each pair of transistors may be precharged to decrease data access time.

16. The cache tag memory of claim 13, wherein the first transistor and the second transistor are p-channel MOSFETs.

17. The cache tag memory system of claim 14, wherein the transistor having a drain connected to the output, a source connected to the second power supply voltage, and a gate connected to a clock signal is a n-channel MOSFET.

18. The cache tag memory of claim 17, further comprising a transistor having a drain connected to a drain of the first transistor in each pair of transistors, a source connected to the second power supply voltage, and a gate connected to the clock signal.

19. A cache tag RAM compare circuit comprising:

a plurality of true and complement data bus lines, wherein each true data bus line has a first transistor, having a drain connected to the true data bus line, a source connected to a first power supply voltage, and a gate connected to a complement data input and wherein each complement data bus line has a second transistor having a drain connected to the complement data bus line, a source connected to the first power supply voltage, and a gate connected to the data input;

a comparison circuit, the comparison circuit having a plurality of input pairs, each input pair having a true input and a complement input, and an output for indicating the presence of a hit, wherein true input of each input pair is connected to a true data bus line and the complement input of each input pair is connected to a complement data bus line, wherein the presence of a hit may be indicated at the output of the comparison circuit.

20. The cache tag RAM compare circuit of claim 19, wherein the first and second transistors are n-channel MOSFETs.

21. The cache tag RAM compare circuit of claim 19, wherein the comparison circuit further comprises:

a plurality of transistors pairs, wherein a first transistor in each pair is connected in series with a second transistor in the pair, a source of the first transistor in the pair is connected to a second power supply voltage and a drain of the second transistor in the pair is connected to the output of the compare circuit and wherein a gate of the first transistor is connected to the complement input of an input pair and a gate of the second transistor is connected to the true input of the input pair.

22. The cache tag RAM compare circuit of claim 21, wherein the comparison circuit further includes a transistor having a drain connected to the output, a source connected to a first power supply voltage, and a gate connected to a clock signal, wherein the output of the comparison circuit may be precharged to the first power supply voltage.

23. The cache tag RAM compare circuit of claim 21, wherein the comparison circuit further includes a transistor having a drain connected to a drain of the first transistor in each pair of transistors, a source connected to a first power supply voltage, and a gate connected to the clock signal, wherein the series node of each pair of transistors may be precharged to decrease data access time.

24. The cache tag RAM compare circuit of claim 21, wherein the first and second transistors in a transistor pair are p-channel MOSFETs.

25. The cache tag RAM compare circuit of claim 22, wherein the transistor having a drain connected to the output, a source connected to a first power supply voltage, and a gate connected to a clock signal is a n-channel MOSFET.

26. The cache tag RAM compare circuit of claim 23, wherein the transistor having a drain connected to a drain of the first transistor in each pair of transistors, a source connected to a first power supply voltage, and a gate connected to the clock signal is a n-channel MOSFET.

\* \* \* \* \*